United States Patent
Floros et al.

(10) Patent No.: US 9,618,544 B2
(45) Date of Patent: Apr. 11, 2017

(54) SYSTEM AND METHOD FOR VERIFYING A REFERENCE VOLTAGE FOR BATTERY CELL MONITORING

(75) Inventors: John H. Floros, Novi, MI (US); Paul W. Firehammer, Saline, MI (US)

(73) Assignee: A123 Systems LLC, Waltham, MA (US)

( * ) Notice: Subject to any disclaimer, the term of this patent is extended or adjusted under 35 U.S.C. 154(b) by 804 days.

(21) Appl. No.: 13/877,244

(22) PCT Filed: Oct. 6, 2011

(86) PCT No.: PCT/US2011/055029
§ 371 (c)(1),
(2), (4) Date: Jun. 14, 2013

(87) PCT Pub. No.: WO2012/048069
PCT Pub. Date: Apr. 12, 2012

(65) Prior Publication Data
US 2013/0265059 A1  Oct. 10, 2013

Related U.S. Application Data

(60) Provisional application No. 61/391,396, filed on Oct. 8, 2010.

(51) Int. Cl.
*G01R 19/165* (2006.01)
*G01R 31/36* (2006.01)
*G01R 1/28* (2006.01)
*G01R 19/257* (2006.01)

(52) U.S. Cl.
CPC . *G01R 19/16566* (2013.01); *G01R 19/16542* (2013.01); *G01R 31/362* (2013.01); *G01R 1/28* (2013.01); *G01R 19/257* (2013.01); *G01R 31/36* (2013.01); *G01R 31/3606* (2013.01); *G01R 31/3658* (2013.01)

(58) Field of Classification Search
CPC  G01R 31/36; G01R 31/3606; G01R 31/3679; G01R 31/3648
See application file for complete search history.

(56) References Cited

U.S. PATENT DOCUMENTS

| | | |
|---|---|---|
| 5,514,945 A | 5/1996 | Jones |
| 5,736,949 A | 4/1998 | Ong et al. |
| 5,774,733 A | 6/1998 | Nolan et al. |
| 6,313,637 B1 * | 11/2001 | Iino et al. ............ 324/434 |
| 6,804,557 B1 | 10/2004 | Kroll |
| 7,759,902 B2 * | 7/2010 | Gangsto et al. ......... 320/134 |
| 2001/0054879 A1 * | 12/2001 | Okada et al. ........... 320/132 |
| 2004/0128089 A1 * | 7/2004 | Barsoukov et al. ...... 702/65 |

OTHER PUBLICATIONS

ISA Korea, International Search Report and Written Opinion of PCT/US2011/055029, May 3, 2012, WIPO, 10 pages.

* cited by examiner

*Primary Examiner* — Samuel Berhanu
*Assistant Examiner* — Tarikh Rankine
(74) *Attorney, Agent, or Firm* — McCoy Russell LLP

(57) ABSTRACT

Systems and methods for verifying a reference voltage within a battery pack are disclosed. In one example, an assessment of a reference voltage is made via a band-gap voltage of a microcontroller. The system and method may be particularly useful determining whether or not the reference voltage has drifted from a desired voltage.

20 Claims, 5 Drawing Sheets

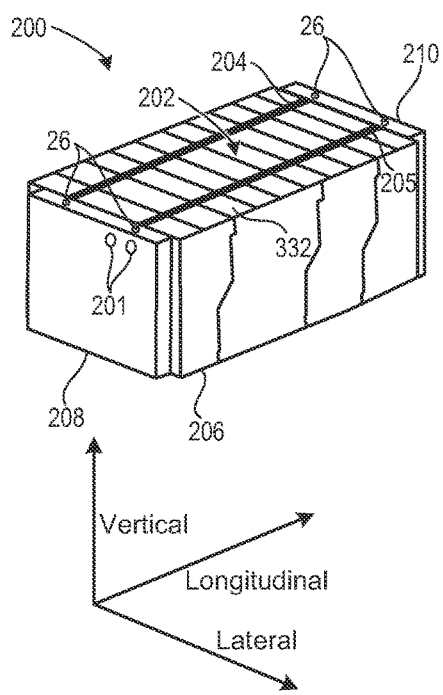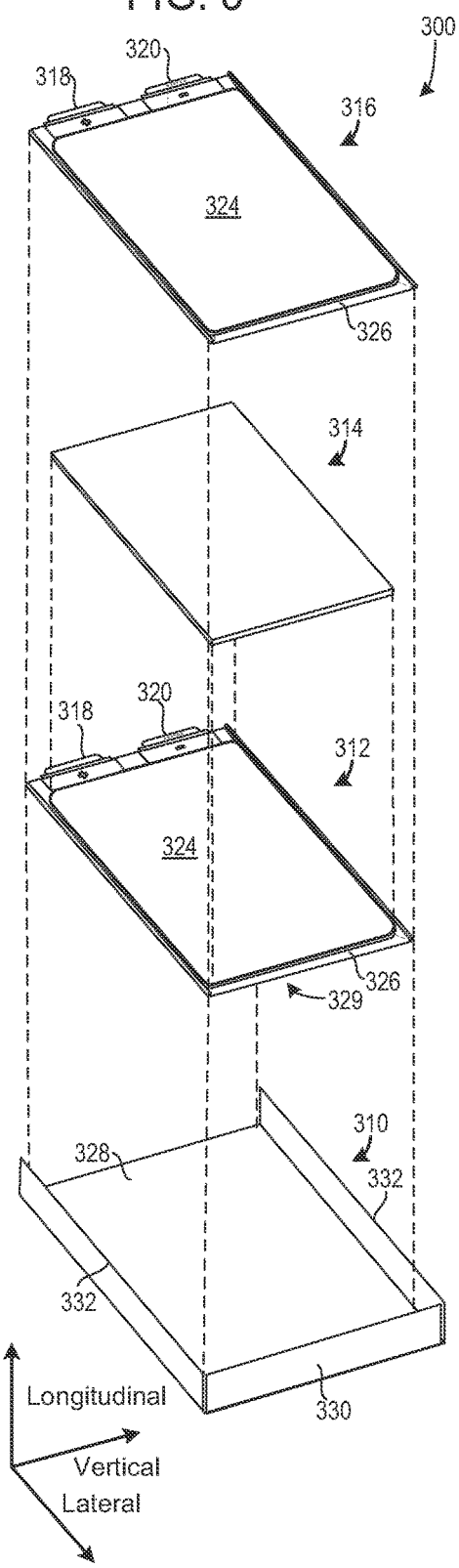

ially, the inventors have developed a method for verifying a reference voltage for battery cell voltage monitoring, comprising: referencing a first analog to digital converter to a reference voltage; providing a band-gap voltage from the reference voltage; and indicating degradation of the reference voltage when the band-gap reference voltage varies from a predetermined voltage range.

SYSTEM AND METHOD FOR VERIFYING A REFERENCE VOLTAGE FOR BATTERY CELL MONITORING

CROSS REFERENCE TO RELATED APPLICATIONS

This application claims priority from International Patent Application Serial No. PCT/US2011/055029, filed Oct. 6, 2011 and entitled SYSTEM AND METHOD FOR VERIFYING A REFERENCE VOLTAGE FOR BATTERY CELL MONITORING, which claims priority to U.S. Provisional Patent Application Ser. No. 61/391,396, filed Oct. 8, 2010 and entitled SYSTEM AND METHOD FOR VERIFYING A REFERENCE VOLTAGE FOR BATTERY CELL MONITORING, the entirety of both which are hereby incorporated herein by reference for all intents and purposes.

TECHNICAL FIELD

The present description relates to verifying a reference voltage for battery cell monitoring. In one example, the battery cells are included in a battery pack provides power to a vehicle.

BACKGROUND AND SUMMARY

A battery pack may comprise a plurality of battery cells. The battery cells may be configured in parallel and series to provide a desired level of battery voltage at a desired amp-hour rating. Battery cells arranged in series increase battery voltage while battery cells arranged in parallel increase the amp-hour rating of the battery. When a battery cells are discharged battery cell voltage may decrease. On the other hand, when battery cells are charged battery cell voltage may increase. Thus, battery voltage can be used as an indication of an amount of charge stored in a battery cell so that a battery pack can be charged or discharged as is prudent, at least under some conditions.

To facilitate battery pack charging and discharging, it is possible to determine battery cell voltage via an analog to digital converter (ADC). However, an ADC requires a stable reference voltage to accurately determine a voltage of a battery cell. If the reference voltage drifts (e.g., changes) over time, voltage measurements made by an ADC of battery cell voltage may degrade in accuracy. Consequently, it may be difficult to provide an accurate battery cell voltage measurement. Further, it may be difficult to make an accurate determination of total battery pack voltage from individual battery cell voltage measurements made by an ADC. As a result, it may be desirable to limit battery pack charging and discharging to a reduced level so that the battery pack voltage is within a desired range.

The inventors herein have recognized the above issues and developed an approach to address them. Specifically, the inventors have developed a method for verifying a reference voltage for battery cell voltage monitoring, comprising: referencing a first analog to digital converter to a reference voltage; providing a band-gap voltage from the reference voltage; and indicating degradation of the reference voltage when the band-gap reference voltage varies from a predetermined voltage range.

By checking a reference voltage which supplies a voltage to an ADC that monitors battery cell voltages via a band-gap reference, it may be possible to determine whether or not the reference voltage is operating at a desired voltage so that limiting of battery pack charging and discharging due to a changing reference voltage may be reduced. Thus, when it is determined that the reference voltage is operating at a desired voltage, a higher level of confidence in ADC measurements may be achieved. In one example, the present description provides for monitoring the reference voltage via a band-gap voltage of a microcontroller. If a voltage of the band-gap voltage varies by more than a predetermined amount of voltage, a condition of degradation can be indicated to a battery pack management system. In this way, it is possible for a plurality of modules to indicate reference voltage degradation within a battery pack.

The present description may provide several advantages. In particular, the approach can assess reference voltage degradation via an internal temperature compensated band-gap voltage. Further, the approach can reduce system costs as a second reference voltage is not required to assess the reference voltage.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 2 shows a schematic view of an exemplary battery module;

FIG. 3 shows an exploded schematic view of an exemplary battery cell stack;

DETAILED DESCRIPTION

Figure 1:
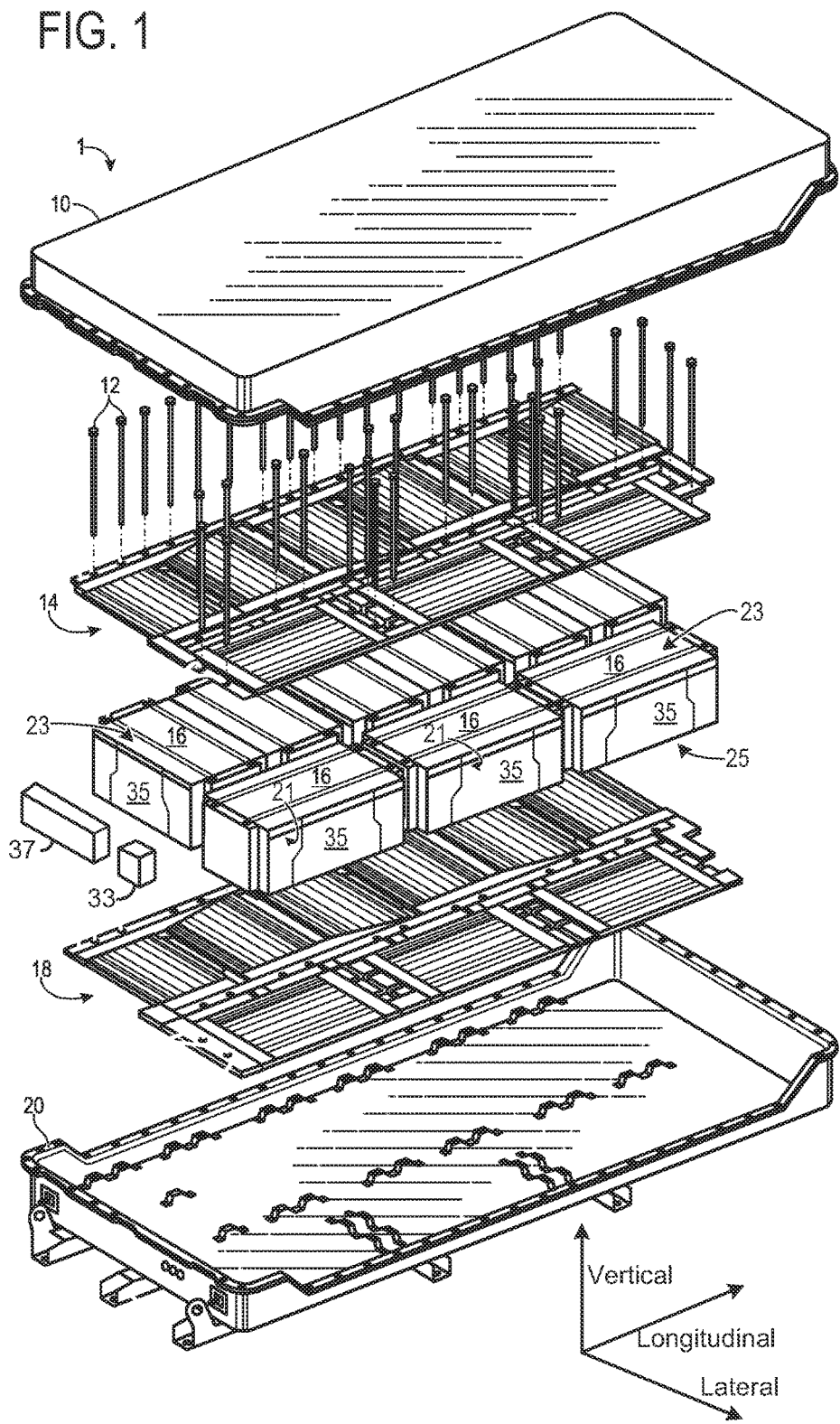
FIG. 1 shows an exploded schematic view of a battery pack or assembly.
Figure 5:
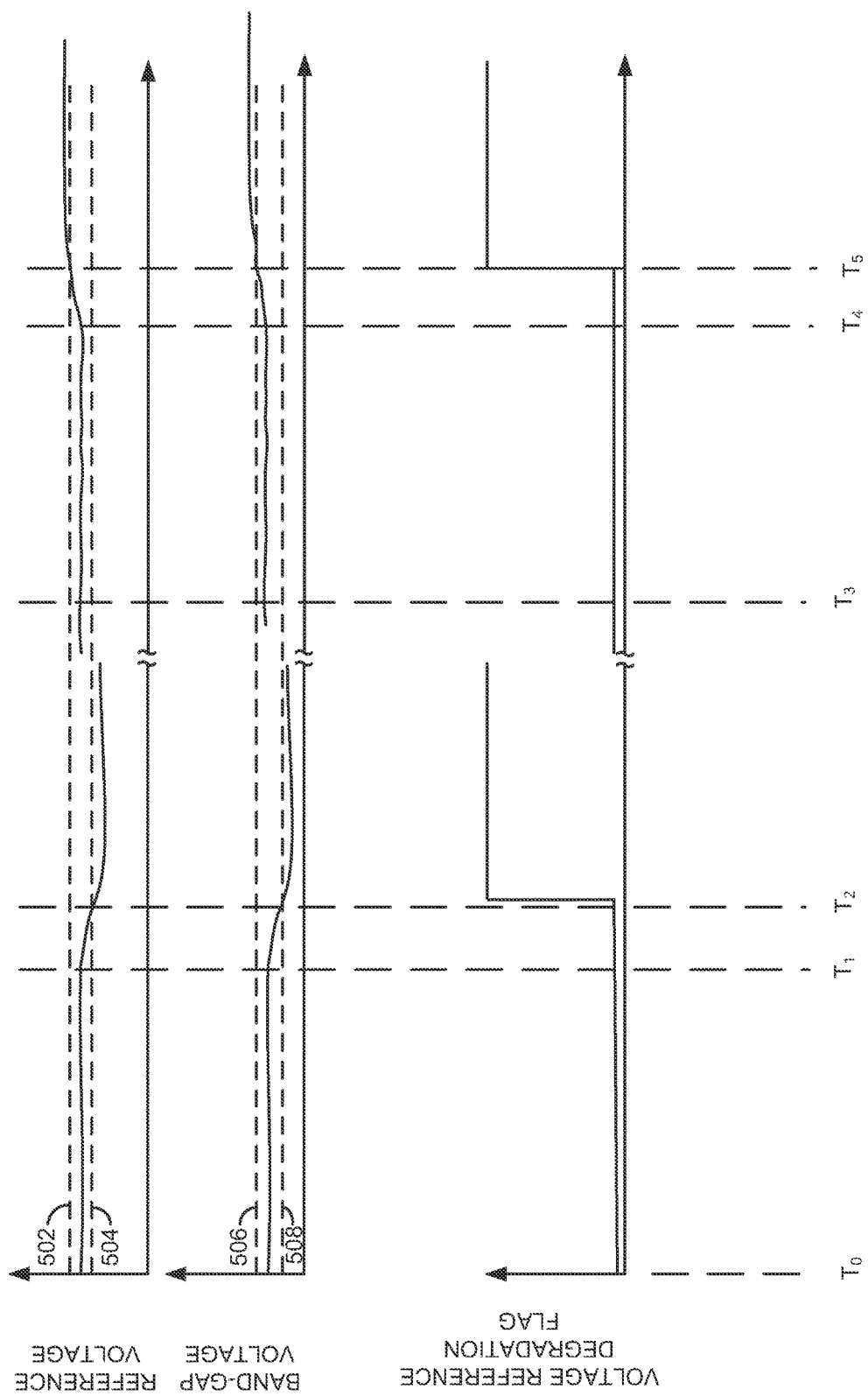
FIG. 5 shows a prophetic example of signals if interest for verifying a reference voltage for battery cell monitoring.
Figure 6:
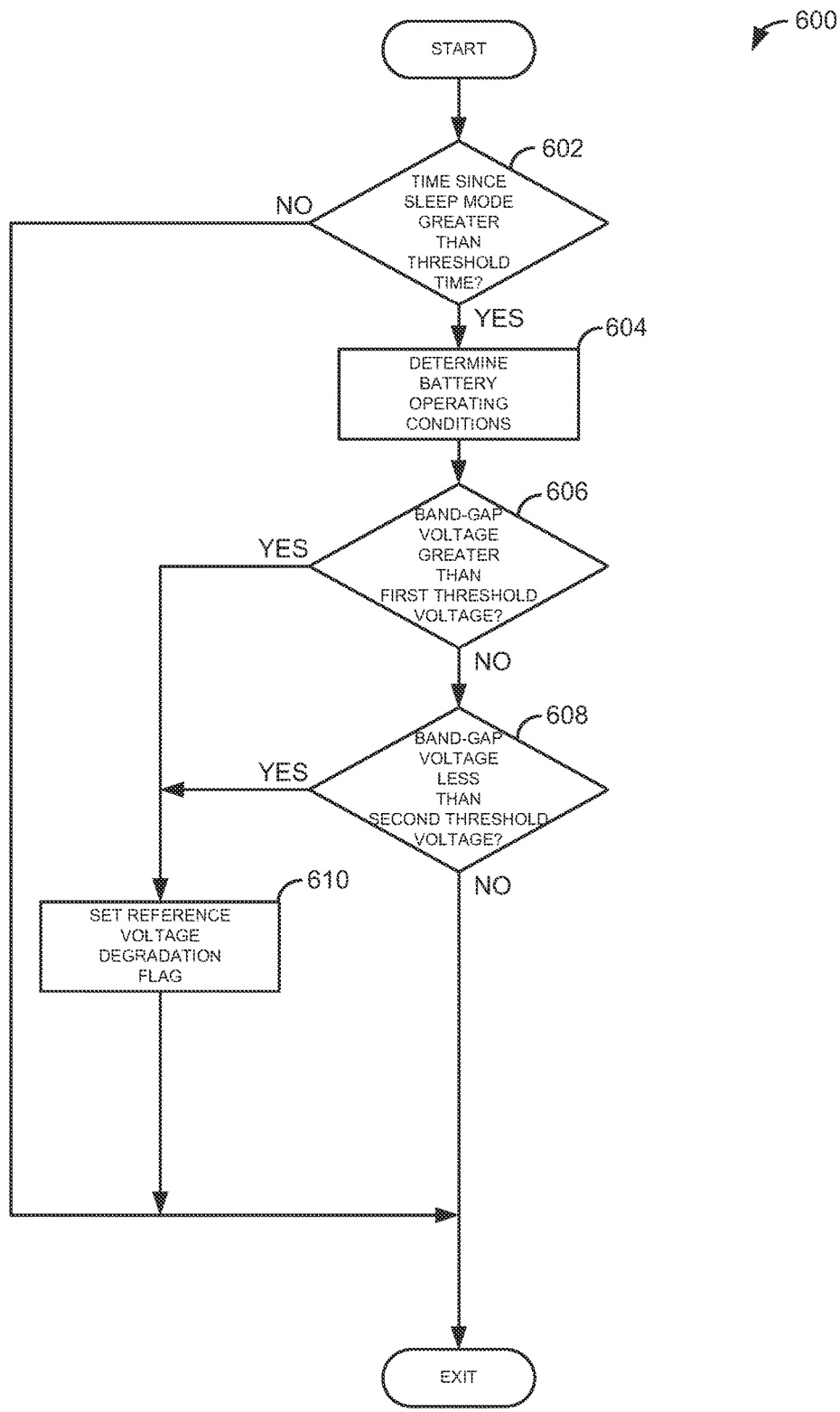
FIG. 6 shows a flowchart of a method for verifying a reference voltage for battery cell monitoring.

The present description is related to verifying a reference voltage for battery cell monitoring. In one example, the battery cells may be included in a battery pack as illustrated in FIG. 1. Battery cells such as those illustrated in FIGS. 2-3 may be combined as shown in FIG. 1. The reference voltage may be configured as an ADC reference voltage according the battery pack electrical schematic of FIG. 4. A graphical example of one way to evaluate and indicate degradation of a reference voltage is shown in FIG. 5. In the method of FIG. 6, a band-gap reference voltage is evaluated in view of a desired band-gap voltage to determine whether or not the reference voltage is at a desired voltage.

FIG. 1 shows an exploded view of a battery assembly 1. The battery assembly may include a cover 10, coupling devices 12, a first cooling subsystem 14 (e.g., cold plate), a plurality of battery cell modules 16, a second cooling subsystem 18 (e.g., cold plate), and a tray 20. The cover may be attached to the tray via a suitable coupling device (e.g., bolts, adhesive, etc.,) to form a housing surrounding the coupling devices, the cooling subsystems, and the battery modules, when assembled.

The battery cell modules 16 may include a plurality of battery cells configured to store energy. Although a plurality of battery modules are illustrated, it will be appreciated that in other examples a single battery module may be utilized. Battery cell modules 16 may be interposed between the first cooling subsystem 14 and the second cooling subsystem 18, where the battery modules are positioned with their electrical terminals on a side 21 facing out between the cooling subsystems.

Each battery module may include a first side 23 and a second side 25. The first and the second side may be referred to as the top and bottom side, respectively. The top and bottom sides may flank the electrical terminals, discussed in greater detail herein with regard to FIGS. 2-3. In this example, the top side of each battery module is positioned in a common plane in the battery assembly. Likewise, the bottom side of each battery module is positioned in another common plane in the battery assembly. However, in other examples only the top side or the bottom side of each battery module may be positioned in a common plane. In this way, the cooling subsystems may maintain direct contact with the top sides and the bottom sides of the battery modules to increase heat transfer and improve cooling capacity, as described in further detail herein, wherein the cooling subsystems and the battery modules may be in face-sharing contact. Additional details of an exemplary battery module are described herein with regard to FIGS. 2-3. In alternate examples, only one of the cooling subsystems may be included in battery assembly 1, such as an upper cooling subsystem (subsystem 14 in this example). Moreover, the position, size, and geometry of the first and second cooling subsystems are exemplary in nature. Thus, the position, size, and/or geometry of the first and/or second cooling subsystems may be altered in other examples based on various design parameters of the battery assembly.

Battery assembly 1 may also include an electrical distribution module 33 (EDM), monitor and balance boards 35 (MBB), and a battery control module 37 (BCM). Voltage of battery cells in battery cell modules 16 may be monitored and balanced by MBBs that are integrated onto battery cell modules 16. Balancing battery cells refers to equalizing voltages between a plurality of battery cells in a battery cell stack. Further, battery cell voltages between battery cell stacks can be equalized. MBBs may include a plurality of current, voltage, and other sensors. The EDM controls the distribution of power from the battery pack to the battery load. In particular, the EDM contains contactors for coupling high voltage battery power to an external battery load such as an inverter. The BCM provides supervisory control over battery pack systems. For example, the BCM may control ancillary modules within the battery pack such as the EDM and cell MBB. Further, the BCM may be comprised of a microcontroller having random access memory, read only memory, input ports, real time clock, output ports, and a controller area network (CAN) port for communicating to systems outside of the battery pack as well as to MBBs and other battery pack modules.

FIG. 2 shows an exemplary battery module 200 that may be included in the plurality of battery cell modules 16, shown in FIG. 1. Battery module 200 may include a battery cell stack having a plurality of stacked battery cells and output terminals 201. The stacked arrangement allows the battery cells to be densely packed in the battery module.

FIG. 3 shows an exploded view of a portion of an exemplary battery cell stack 300. As shown the battery cell stack is built in the order of a housing heat sink 310, battery cell 312, compliant pad 314, battery cell 316, and so on. However, it will be appreciated that other arrangement are possible. For example, the battery cell stack may be built in the order of a housing heat sink, battery cell, housing heat sink, etc. Further in some examples, the housing heat sink may be integrated into the battery cells.

Battery cell 312 includes cathode 318 and anode 320 for connecting to a bus bar (not shown). The bus bar routes charge from one batter cell to another. A battery module may be configured with battery cells that are coupled in series and/or parallel. Bus bars couple like battery cell terminals when the battery cells are combined in parallel. For example, the positive terminal of a first battery cell is coupled to the positive terminal of a second battery cell to combine the battery cells in parallel. Bus bars also couple positive and negative terminal of battery cell terminals when it is desirable to increase the voltage of a battery module. Battery cell 312 further includes prismatic cell 324 that contains electrolytic compounds. Prismatic cell 324 is in thermal communication with cell heat sink 326. Cell heat sink 326 may be formed of a metal plate with the edges bent up 90 degrees on one or more sides to form a flanged edge. In the example of FIG. 3, two opposing sides include a flanged edge. However, other geometries are possible. Battery cell 312 is substantially identical to battery cell 316. Therefore similar parts are labeled accordingly. Battery cells 312 and 316 are arranged with their terminals in alignment and exposed. In battery module 200 shown in FIG. 2 the electric terminals are coupled to enable energy to be extracted from each cell in the battery module. Returning to FIG. 3, compliant pad 314 is interposed between battery cell 312 and battery cell 316. However, in other examples the compliant pad may not be included in the battery cell stack.

Housing heat sink 310 may be formed by a metal plate having a base 328 with the edges bent up 90 degrees on one or more sides to form a flanged edge. In FIG. 3 longitudinally aligned edge 330 and vertically aligned edges 332 are bent flanged edges. As depicted, the housing heat sink is sized to receive one or more battery cells. In other words, one or more battery cells may be positioned within base 328. Thus, the flanged edges of the battery cells may be in contact with housing heat sink and underside 329 of battery cell 312 may be in contact with the base of the housing heat sink, facilitating heat transfer.

One of the longitudinally aligned edges 332 of the housing heat sink 310 may form a portion of the top side 202 of battery module 200, as shown in FIG. 2. Similarly, one of the longitudinally aligned edges 332 may form a portion of the bottom side of the battery module. Thus, the longitudinally aligned edges of the housing heat sink may be in contact with the first and the second cooling subsystems to improve heat transfer. In this way, heat may be transferred from the battery cells to the exterior of the battery module.

The battery cells may be strapped together by binding bands 204 and 205. The binding bands may be wrapped around the battery cell stack or may simply extend from the front of the battery cell stack to the back of the battery cell stack. In the latter example, the binding bands may be coupled to a battery cover. In other examples, the binding bands may be comprised of threaded studs (e.g., metal threaded studs) that are bolted at the ends. Further, various other approaches may be used to bind the cells together into the stack. For example, threaded rods connected to end plates may be used to provide the desired compression. In another example, the cells may be stacked in a rigid frame with a plate on one end that could slide back and forth against the cells to provide the desired compressive force. In yet other examples, rods held in place by cotter pins may be used to secure the battery cells in place. Thus, it should be understood that various binding mechanisms may be used to hold the cell stack together, and the application is not limited to metal or plastic bands. Cover 206 provides protection for battery bus bars (not shown) that route charge from the plurality of battery cells to output terminals of the battery module.

The battery module may also include a front end cover 208 and a rear end cover 210 coupled to the battery cell stack. The front and rear end covers include module openings 26. However, in other examples the module openings may be included in a portion of the battery module containing battery cells.

Figure 4:
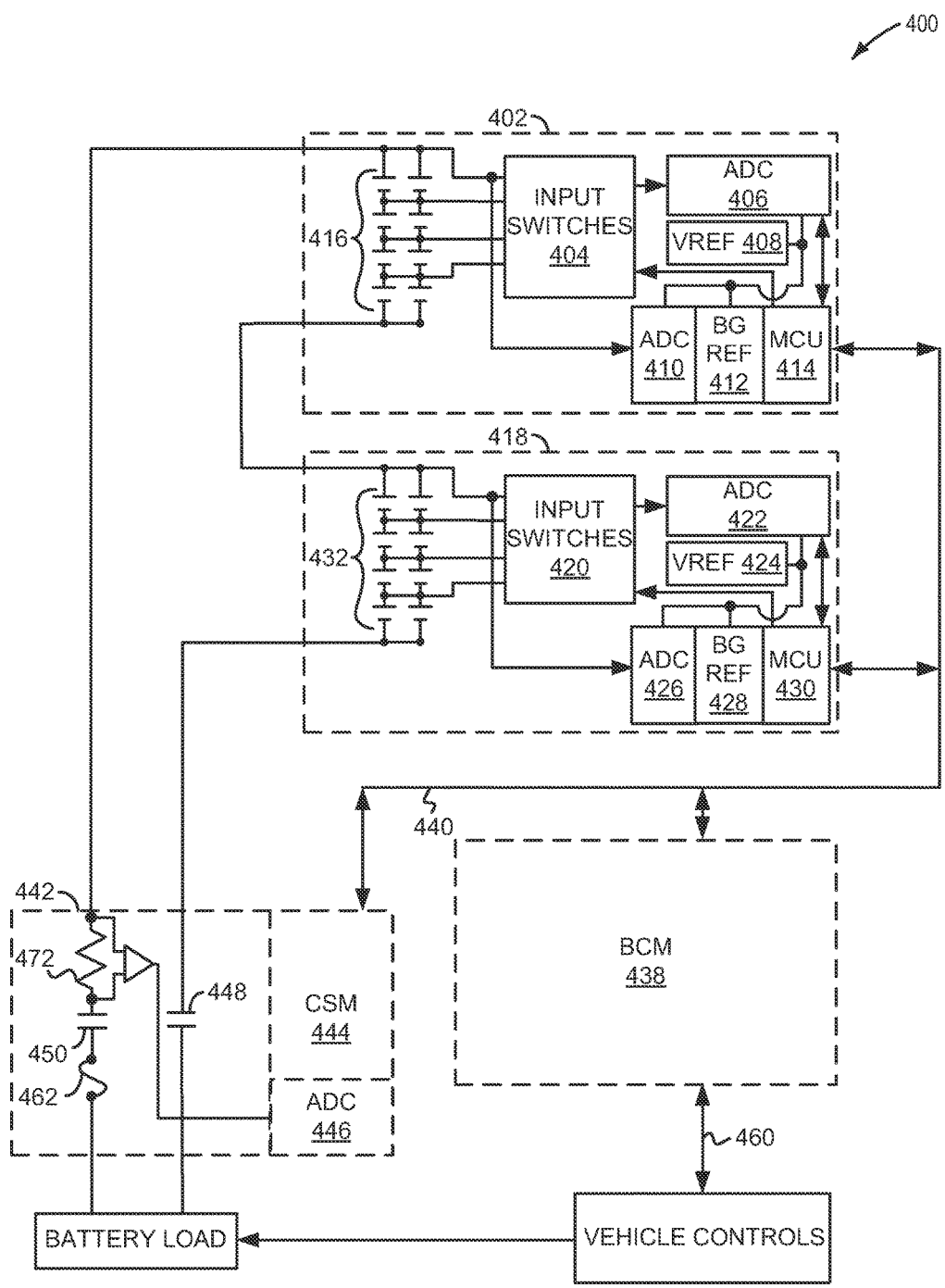
FIG. 4 shows an electrical schematic diagram for an example battery pack.

Referring now to FIG. 4, a schematic diagram for controlling battery pack output is shown. In this example, battery pack 400 includes two battery cell modules 402 and 418 as indicated by the dashed lines. Further, current sense module 444 and battery control or management module 438 are shown.

Battery cells 416 and 432 are shown identically configured and are connected in series. However, battery cell modules may be configured with different numbers of battery cells, and the battery cells may be configured differently if desired. For example, battery cells 416 and 432 are comprised of eight battery cells each. Four of the battery cells are arranged in series. Further, the four battery cells are arranged in parallel with four other battery cells that are arranged in series. In this configuration, each battery module 402 and 418 outputs a voltage that is related to the number of battery cells connected in series as well as the individual voltage output of each battery cell. And, as discussed above, the current capacity or amp-hour rating of the battery module may be related to the number of battery cells connected in parallel. As the number of battery cells arranged in parallel increases, the battery module amp-hour rating increases. As the number of battery cells arranged in series increases, the output voltage of the battery module increases. Thus, the voltage output of a battery pack can be increased or decreased by changing the number of battery cells arranged in a series connection. Likewise, the battery pack amp-hour rating may be increased or decreased by changing the number of battery cells arranged in parallel. Therefore, in this example, the battery pack voltage may be increased by adding additional battery cells in series with the battery cells of battery cell modules 416 and 432. Alternatively, the battery module amp-hour rating may be increased by adding more battery cells in parallel to battery cells 416 and 432.

Battery cell modules 402 may be configured to include a high voltage bus and a low voltage bus. The high voltage bus may be isolated from the low voltage bus to reduce ground loops and electrical noise within the battery pack. The battery cells and power electronics can be included on a portion of the battery cell module 402 that are in communication with the high voltage bus. Low level electronics are in communication with the low voltage bus.

Battery cell modules 402 and 418 include input switches 404 and 420 for selectively coupling ADCs 406 and 422 to battery cells 416 and 432 respectively. MCUs 414 and 430 control the state of switches 404 and 420 by way of digital outputs from the respective MCUs. Input switches 404 and 420 are configured such that ADCs 406 and 422 may be coupled to individual battery cells to measure battery cell voltage without being influenced by the voltage of battery cells that may be placed in series with the battery cell being measured. In one example, each MCU 414 and 430 may couple each series connected battery cell to respective ADCs 406 and 422. When battery cells are coupled in parallel, input switches 404 and 420 couple ADCs 406 and 422 to the battery cells of a battery module that are coupled in parallel. Thus, each ADC coupled to a battery cell stack may be configured to measure the voltage of one or more battery cells coupled in parallel within the respective battery cell stack.

ADCs 406 and 422 are configured as high resolution (e.g., 12 or 16 bit resolution ADCs) devices that are external or off chip from MCUs 414 and 430 although ADCs may be on chip in other examples and may have different resolutions (e.g., 8 bit resolution). In one example, ADCs 406 and 422 communicate with MCUs 414 and 430 respectively by way of SPI ports. The SPI ports are used to transfer battery cell voltages to each MCU as the individual MCUs command input switches 404 and 420 to cycle through battery cells 416 and 432 respectively. By cycling through the switches, individual series battery cells are coupled to ADCs 406 and 422 for determining battery cell voltages.

Reference voltage sources 408 and 424 provide a high accuracy reference voltage to ADCs 406 and 422, respectively. In addition, reference voltage sources 408 and 424 provide power to generate band-gap voltages internal to MCUs 414 and 430, respectively. The band-gap voltage internal to MCU 414 is provided by band-gap voltage source 412 and is related to the output of reference voltage 408, and the band-gap voltage internal to MCU 430 is provided by band-gap voltage source 428 and is related to the output reference voltage 424. Consequently, if the reference voltage provided by reference voltage source 408 varies, the band-gap voltage provided by band-gap voltage source 412 to MCU 414 varies. Likewise, if the reference voltage provided by reference voltage source 424 varies, the band-gap voltage provided by band-gap voltage source 428 to MCU 430 varies.

ADCs 410 and 426 are lower resolution (e.g., 8 bit resolution) devices that are integrated to MCUs 414 and 430. In alternate examples, ADCs 410 and 426 may be of higher resolution (e.g., 12 or 16 bit resolution) and external from MCUs 414 and 430. ADCs 410 and 426 are configured to measure the series voltage provided by battery cells 416 and 432 for the respective battery cell stacks 402 and 418. For example, ADC 410 is configured to measure the voltage provided by the series combination of four battery cells coupled in parallel to four other battery cells, the battery cells indicated at 416. Thus, the ADC of an MBB is configured to measure the series combination of battery cells of a battery module. Of course, an ADC of a MBB coupled to a battery module may be configured to measure the voltage of additional or fewer battery cells than the four battery cells shown in FIG. 4. Further, as discussed above, the series combination of battery cells 416 acts to increase the output voltage of the battery module 402. In one example, MCU 414 includes instructions for comparing a sum of battery cell voltages determined from ADC 406 to a voltage of the battery cell module 402 determined from ADC 410. In particular, MCU 414 includes instructions for determining a difference between the sum of individual battery cell voltages determined from ADC 406 from an individual battery cell voltage measurement from ADC 410.

ADCs 410 and 426 are further configured to measure and monitor band-gap reference voltages provided by band-gap reference voltage sources 412 and 428. ADC 410 is provided a reference voltage from reference voltage source 408. Similarly, ADC 426 is provided a reference voltage from reference voltage source 424. Thus, the measurements of band-gap voltage provided by ADCs 410 and 426 are referenced to the reference voltage from reference voltage sources 408 and 424, respectively.

MCUs 414 and 430 control input switches 404 and 420 as well as ADCs 406 and 410, 422, and 426. Further, MCUs 410 and 430 may store the respective battery voltages to memory and perform arithmetic and logical operations on battery voltage data captured by ADCs 406, 410, 422, and 426. MCUs 414 and 430 also have an internal temperature sensor so the measured temperature of the MCU can be used to adjust for temperature drift of the internal band-gap voltage.

BCM 438 communicates with MCUs 414 and 430 of battery cell modules 402 and 418 by way of CAN bus 440; however, other types of communication links are also possible and anticipated. BCM 438 may acquire battery voltages and status indicators (e.g., flags that indicate degradation of an ADC, degradation of a reference voltage source, battery cell, or MCU) from battery cell modules 402 and 418. BCM 438 also communicates with EDM 442 via hardwired digital inputs and outputs for opening and closing contactors 450 and 448. In an alternative example, BCM 438 may communicate to EDM 442 via CAN 440 for sending instructions to close contactors 450 and 448 when it is determined to couple battery cell stacks 402 and 432 to the battery load or source. Contactors 450 and 448 act as electrically controlled switches and do not interrupt short circuit current without instruction from BCM 438. In one example, contactors 450 and 448 are normally open and include a closing coil and metallic contacts that may be engaged and disengaged with metallic current carrying conductors by operating the closing coil. In one example, the contactors open by physically moving apart. In other examples where less power is provided by the battery pack, the output contactor may be a silicon based contactor such as a FET or bi-polar transistor, for example.

CSM 444 includes an ADC 446 for measuring battery pack current on the battery side of contactors 450 and 448. Current shunt 472 provides a voltage that is proportional to current flow entering or exiting the battery pack to a microcontroller within CSM 444. The CSM microcontroller converts battery pack current into digital data via ADC 446. The CSM microcontroller transmits current data to BCM 438 via CAN bus 440. BCM 438 also communicates with a vehicle controller via CAN bus 460. BCM 438 may communicate a variety of battery related information to a vehicle controller via CAN bus 460. For example, BCM 438 can send an indication of available battery current capacity and/or an indication of battery current sinking or sourcing capacity. Fuse 462 provides current limiting protection to the battery pack.

Thus, the system of FIGS. 1-4 provides for a system for assessing an analog to digital converter reference voltage for monitoring a battery cell voltage, comprising: a reference voltage; a first analog to digital converter, the first analog to digital converter in electrical communication with the reference voltage, the first analog to digital converter configured to sample a voltage of at least one battery cell; and a controller, the controller in electrical communication with the first analog to digital converter, the controller including a second analog to digital converter and an internal band-gap voltage, the internal band-gap voltage responsive to the reference voltage, the controller including instructions for monitoring the internal band-gap voltage to verify the reference voltage is a desired voltage. The system includes where the first analog to digital converter is external to the controller, and where the controller includes further instructions for setting a flag to indicate degradation of the reference voltage to a battery pack management system. The system includes where the second analog to digital converter is configured to monitor the internal band-gap voltage, and where the controller includes further instructions for comparing a voltage of the internal band-gap voltage to a predetermined voltage range. The system includes where the second analog to digital converter is integrated in the controller and is further configured to monitor a voltage of a plurality of battery cells. The system includes where the controller includes further instructions for comparing a sum of individual battery cell voltage measurements from the first analog to digital converter to a measurement of a single voltage from the second analog to digital converter, the single voltage from the second analog to digital converter provided via a plurality of battery cells. The system includes where the instructions for comparing a sum of individual battery cell voltage measurements from the first analog to digital converter to a measurement of a single voltage from the second analog to digital converter includes determining a difference between the sum of individual battery cell voltage measurements from the first analog to digital converter and a single sample output from the second analog to digital converter. The system includes where a voltage of the internal band-gap voltage is based on the reference voltage.

The system of FIGS. 1-4 further provides for a system for assessing a system for assessing an analog to digital converter reference voltage for monitoring a battery cell voltage, comprising: a reference voltage; a first analog to digital converter, the first analog to digital converter in electrical communication with the reference voltage, the first analog to digital converter configured to sample a voltage of at least one battery cell, the first analog to digital converter configured to determine a voltage of the at least one battery cell referenced with respect to the reference voltage; and a controller, the controller in electrical communication with the first analog to digital converter, the controller including a second analog to digital converter and an internal band-gap voltage, the internal band-gap voltage responsive to the reference voltage, the second analog to digital converter configured to determine a reference voltaged with respect to the reference voltage, the controller including instructions for monitoring the internal band-gap voltage via the second analog to digital converter to verify the reference voltage is a desired voltage. The system includes where the controller includes further instructions for indicating a condition of degradation of the reference voltage to a battery pack management system. The system includes where the instructions for monitoring the internal band-gap voltage include instructions for comparing a voltage of the internal band-gap voltage to a predetermined voltage range. The system includes where the predetermined voltage range varies with a temperature of a battery pack, the battery pack including the controller and the at least one battery cell. The system includes where the reference voltage is a voltage greater than the internal band-gap voltage, and where the internal band-gap voltage is based on the reference voltage, and where the internal band-gap voltage is configured to vary as the reference voltage varies. The system includes where the controller includes further instructions for comparing a sum of individual battery cell voltage measurements from the first analog to digital converter to a measurement of a single voltage from the second analog to digital converter, the sum of individual battery cell voltage measurements referenced with respect to the reference voltage, the single voltage of the second analog to digital converter referenced with respect to the reference voltage and related to a plurality of battery cells. The system includes where the first analog to digital converter is external of the controller, and where that at least one battery cell is a lithium-ion battery cell.

Referring now to FIG. 5, a prophetic example of signals of interest for verifying a reference voltage for battery cell monitoring is shown. The illustrated signals may be available from the system shown in FIGS. 1-4 executing the method of FIG. 6.

The first plot from the top of FIG. 5 represents a reference voltage with respect to time. The Y axis represents voltage, and voltage increases in the direction of the Y axis arrow. The X axis represents time, and time increases in the direction of the X axis arrow. Horizontal line 502 represents a first threshold voltage for comparing against the voltage output from the reference voltage source. Horizontal line 504 represents a second threshold voltage for comparing against the voltage output from the reference voltage source. In one example, the area between horizontal line 502 and horizontal line 504 indicates a desired range of voltage output for the reference voltage source. The values represented by horizontal lines 502 and 504 can be varied with battery operating conditions if desired. For example, the voltage range between horizontal line 502 and 504 can be increased as a temperature of a battery pack increases. In another example, the voltage range between horizontal line 502 and 504 can be adjusted based on the chemistry of the battery cell being measured by the ADC.

The second plot from the top of FIG. 5 represents band-gap voltage internal to a microcontroller of a battery cell stack monitoring and balancing board. The Y axis represents voltage, and voltage increases in the direction of the Y axis arrow. The X axis represents time, and time increases in the direction of the X axis arrow. Horizontal line 506 represents a first threshold voltage for comparing against the voltage output from the band-gap voltage source. Horizontal line 508 represents a second threshold voltage for comparing against the voltage output from the band-gap voltage source. In one example, the area between horizontal line 506 and horizontal line 508 indicates a desired range of voltage output for the band-gap voltage source. The values represented by horizontal lines 506 and 508 can be varied with battery operating conditions if desired. For example, the voltage range between horizontal line 506 and 508 can be increased as a temperature of a battery pack increases. In another example, the voltage range between horizontal line 506 and 508 can be adjusted based on the specifications of the microcontroller generating the band-gap voltage.

The sequence of FIG. 5 begins at $T_0$ and proceeds to the right. At time $T_0$, the reference voltage is in its desired voltage range between horizontal lines 502 and 504. The band-gap voltage produced by a band-gap voltage source within a microcontroller configured to monitor battery cells is also in its desired voltage range between horizontal lines 506 and 508. Therefore, the reference voltage degradation flag is not asserted.

Between times $T_1$ and $T_2$ the reference voltage begins to drift to a lower voltage. The reference voltage may drift to a lower voltage if current demand from the reference voltage increases beyond a desired amount. The band-gap voltage is also shown drifting to a lower voltage since the band-gap voltage is related to the reference voltage. The reference voltage degradation flag remains not asserted between times $T_1$ and $T_2$.

At time $T_2$, the reference voltage and the band-gap voltage fall to levels less than the desired voltage range shown by horizontal lines 502-504 and horizontal lines 506-508. The ADC on the microcontroller chip (e.g., ADC 410 of FIG. 4) converts the band-gap voltage to a digital number that represents the band-gap voltage. The microcontroller (e.g., MCU 414 of FIG. 4) compares the digital number from the ADC to a first upper voltage limit and a second lower voltage limit and determines that the band-gap voltage is out of range (e.g., lower than the desired voltage range). Since the band-gap voltage is related to the reference voltage it can be judged by the microcontroller that the reference voltage is degraded. Therefore, the reference voltage degradation flag is asserted by the microcontroller shortly after $T_2$.

Between time $T_2$ and $T_3$ a break in the X axis is shown to indicated a break in time. Further, the voltage degradation flag is cleared and the reference voltage and band-gap voltage are once again within the desired voltage ranges defined by 502-504 and 506-508 at time $T_3$.

Between times $T_4$ and $T_5$ the reference voltage begins to drift to a higher voltage. The reference voltage may drift to a higher voltage if the voltage regulator of the reference voltage degrades or if a voltage is added to the reference voltage. The band-gap voltage is also shown drifting to a higher voltage since the band-gap voltage is related to the reference voltage. The reference voltage degradation flag remains not asserted between times $T_4$ and $T_5$.

At time $T_5$, the reference voltage and the band-gap voltage rise to levels greater than the desired voltage range shown by horizontal lines 502-504 and horizontal lines 506-508. The ADC on the microcontroller chip (e.g., ADC 410 of FIG. 4) converts the band-gap voltage to a digital number that represents the band-gap voltage. The microcontroller (e.g., MCU 414 of FIG. 4) compares the digital number from the ADC to a first upper voltage limit and a second lower voltage limit and determines that the band-gap voltage is out of range (e.g., greater than the specified voltage range). Since the band-gap voltage is related to the reference voltage it can be judged by the microcontroller that the reference voltage is degraded. Therefore, the reference voltage degradation flag is asserted by the microcontroller at $T_5$. In one example, the reference voltage degradation flag may remain asserted even if the band-gap voltage returns to the desired voltage range. Further, in some examples the reference voltage degradation flag may not be asserted unless the band-gap voltage is out of the desired voltage range for a predetermined amount of time. In this way, there may be some flexibility to asserting the reference voltage degradation flag.

Referring now to FIG. 6, a method for assessing degradation of a reference voltage that is in electrical communication with at least one battery cell is shown. The method of FIG. 6 is executable via instructions included in a microcontroller such as MCU 414 of FIG. 5.

At 602, method 600 judges whether or not time since sleep mode is greater than a threshold amount of time. In one example, during sleep mode the battery does not sink or source current to an external load. Further, selected systems within the battery may enter state of lower capability (e.g., systems may monitor battery conditions with less frequency) and lower power consumption. For example, the reference and band-gap voltages may be deactivated during sleep mode. Consequently, when the battery pack exits sleep mode a predetermined amount of time may be required before the reference voltage and band-gap voltage stabilize to a desired voltage. If the time since sleep mode is not greater than a threshold amount of time method 600 proceeds to exit. Otherwise, method 600 proceeds to 604.

At 604, method 600 determines battery pack operating conditions. Battery pack operating conditions may include, but are not limited to, a battery pack temperature, band-gap voltages of selected microcontrollers, reference voltages of selected MBBs, and battery pack status. Method 600 proceeds to 606 after battery pack operating conditions are determined.

At 606, method 600 judges whether or not a band-gap voltage of a selected microcontroller is greater than a first threshold voltage. In one example, the band-gap voltage is measured via an ADC on the microcontroller chip (e.g., ADC 410 of MCU 414 as shown in FIG. 4). The first threshold voltage is stored in the microcontroller and may be adjusted for battery pack operating conditions. For example, the first threshold voltage may increase for increasing battery pack temperatures. If the band-gap voltage is greater than the first threshold voltage, method 600 proceeds to 610. Otherwise, method 600 proceeds to 608.

At 608, method 600 judges whether or not a band-gap voltage of a selected microcontroller is less than a second threshold voltage. The second threshold voltage is stored in the microcontroller and may be adjusted for battery pack operating conditions. For example, the second threshold voltage may decrease for increasing battery pack temperatures. If the band-gap voltage is less than the first threshold voltage, method 600 proceeds to 610. Otherwise, method 600 proceeds to exit.

At 610, method 600 sets the reference voltage degradation flag. The reference voltage degradation flag may be provided from a MBB microcontroller to a battery management system such as a BCM to indicate degradation of a reference voltage of a particular MBB. Thus, a plurality of reference voltage degradation flags may be supplied to a BCM when a battery pack is comprised of a plurality of MBBs. If a reference voltage degradation flag is asserted the BCM may take mitigating actions, if desired. For example, the BCM may limit battery pack charging and discharging such that the battery pack may not be charged or discharged to full capacity. In another example, the BCM may indicate a condition of degradation to an external controller and open output contactors to remove battery power from the vehicle. Method 600 proceeds to exit after the reference voltage degradation flag is asserted.

It should be noted that the reference voltage degradation flag may remain asserted until cleared by a technician. In other examples, the reference voltage degradation flay may be cleared after the reference voltage is within a desired voltage range for a predetermined amount of time.

Thus, the method of FIG. 6 provides for a method for verifying a reference voltage for battery cell voltage monitoring, comprising: referencing a first analog to digital converter to a reference voltage; providing a band-gap voltage from the reference voltage; and indicating degradation of the reference voltage when the band-gap reference voltage varies from a predetermined voltage range. In this way, the reference voltage may be monitored. The method further comprises referencing a second analog to digital converter to the band-gap voltage and monitoring the band-gap voltage via the second analog to digital converter. The method includes where the band-gap voltage is internal to a microcontroller and where the reference voltage is external of the microcontroller. The method also includes where the predetermined voltage range varies with a temperature of a battery pack, and where the battery pack includes the reference voltage. In yet another example, the method includes where indicating degradation of the reference voltage includes notifying a battery pack management system. The method also includes where a voltage of the band-gap voltage is less than a voltage of the reference voltage.

As will be appreciated by one of ordinary skill in the art, method described in FIG. 6 may be represented by instructions for a controller and may be represented by one or more of any number of processing strategies such as event-driven, interrupt-driven, multi-tasking, multi-threading, and the like. As such, various steps or functions illustrated may be performed in the sequence illustrated, in parallel, or in some cases omitted. Likewise, the order of processing is not necessarily required to achieve the objects, features, and advantages described herein, but is provided for ease of illustration and description. Although not explicitly illustrated, one of ordinary skill in the art will recognize that one or more of the illustrated steps, functions, or methods may be repeatedly performed depending on the particular strategy being used.

The following claims particularly point out certain combinations and subcombinations regarded as novel and non-obvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A system for assessing an analog to digital converter reference voltage for monitoring a battery cell voltage, comprising:
    a reference voltage of a reference voltage source;
    a first analog to digital converter, the first analog to digital converter in electrical communication with the reference voltage source, the first analog to digital converter configured to sample a voltage of at least one battery cell; and
    a controller, the controller in electrical communication with the first analog to digital converter, the controller including a second analog to digital converter and an internal band-gap voltage of a band-gap voltage source, the internal band-gap voltage responsive to the reference voltage, the controller including instructions for monitoring the internal band-gap voltage to verify the reference voltage is between a predetermined voltage range.

2. The system of claim 1, where the first analog to digital converter is external to the controller, and where the controller includes further instructions for setting a flag to indicate degradation of the reference voltage to a battery pack management system, and where a reference voltage source is distinct from battery cells.

3. The system of claim 2, where the second analog to digital converter is configured to monitor the internal band-gap voltage, and where the controller includes further instructions for comparing a voltage of the internal band-gap voltage to a predetermined voltage range.

4. The system of claim 3, where the second analog to digital converter is integrated in the controller and is further configured to monitor a voltage of a plurality of battery cells.

5. The system of claim 1, where the controller includes further instructions for comparing a sum of individual battery cell voltage measurements from the first analog to digital converter to a measurement of a single voltage from the second analog to digital converter, the single voltage from the second analog to digital converter provided via a plurality of battery cells.

6. The system of claim 5, where the instructions for comparing the sum of individual battery cell voltage measurements from the first analog to digital converter to the measurement of the single voltage from the second analog to digital converter includes determining a difference between the sum of individual battery cell voltage measurements from the first analog to digital converter and a single sample output from the second analog to digital converter.

7. The system of claim 1, where a voltage of the internal band-gap voltage is based on the reference voltage.

8. A system for assessing an analog to digital converter reference voltage for monitoring a battery cell voltage, comprising:
    a reference voltage of a reference voltage source;
    a first analog to digital converter, the first analog to digital converter in electrical communication with the reference voltage, the first analog to digital converter configured to sample a voltage of at least one battery cell, the first analog to digital converter configured to determine a voltage of the at least one battery cell referenced with respect to the reference voltage; and
    a controller, the controller in electrical communication with the first analog to digital converter, the controller including a second analog to digital converter and an internal band-gap of a band-gap voltage source voltage, the internal band-gap voltage responsive to the reference voltage source, the second analog to digital converter configured to monitor the internal band-gap voltage with respect to the reference voltage, the controller including instructions for monitoring the internal band-gap voltage via the second analog to digital converter to verify the reference voltage is between a predetermined voltage range.

9. The system of claim 8, where the controller includes further instructions for indicating a condition of degradation of the reference voltage to a battery pack management system.

10. The system of claim 8, where the instructions for monitoring the internal band-gap voltage include instructions for comparing a voltage of the internal band-gap voltage to a predetermined voltage range.

11. The system of claim 10, where the predetermined voltage range varies with a temperature of a battery pack, the battery pack including the controller and the at least one battery cell.

12. The system of claim 8, where the reference voltage is a voltage greater than the internal band-gap voltage, and where the internal band-gap voltage is based on the reference voltage, and where the internal band-gap voltage varies as the reference voltage varies.

13. The system of claim 8, where the controller includes further instructions for comparing a sum of individual battery cell voltage measurements from the first analog to digital converter to a measurement of a single voltage from the second analog to digital converter, the sum of individual battery cell voltage measurements referenced with respect to the reference voltage, the single voltage of the second analog to digital converter referenced with respect to the reference voltage and related to a plurality of battery cells.

14. The system of claim 8, where the first analog to digital converter is external of the controller, and where the at least one battery cell is a lithium-ion battery cell.

15. A method for verifying a reference voltage for battery cell voltage monitoring, comprising:
    referencing a first analog to digital converter to a reference voltage of a reference voltage source;
    providing a band-gap voltage of a band-gap voltage source from the reference voltage; and
    indicating degradation of the reference voltage via a controller when the band-gap voltage varies from a predetermined voltage range.

16. The method of claim 15, further comprising referencing a second analog to digital converter to the reference voltage and monitoring the band-gap voltage via the second analog to digital converter.

17. The method of claim 16, where the band-gap voltage is internal to a microcontroller and where the reference voltage is external of the microcontroller.

18. The method of claim 16, where the predetermined voltage range varies with a temperature of a battery pack, and where the battery pack includes the reference voltage.

19. The method of claim 15, where indicating degradation of the reference voltage includes notifying a battery pack management system.

20. The method of claim 15, where a voltage of the band-gap voltage is less than a voltage of the reference voltage.

* * * * *